United States Patent
Tanida et al.

(10) Patent No.: US 9,455,739 B2
(45) Date of Patent: Sep. 27, 2016

(54) CODE AMOUNT ESTIMATING METHOD AND APPARATUS, AND PROGRAM AND STORAGE MEDIUM THEREFOR

(75) Inventors: Ryuichi Tanida, Yokosuka (JP); Atsushi Shimizu, Yokosuka (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 2004 days.

(21) Appl. No.: 12/528,434

(22) PCT Filed: Mar. 7, 2008

(86) PCT No.: PCT/JP2008/054158
§ 371 (c)(1),
(2), (4) Date: Aug. 24, 2009

(87) PCT Pub. No.: WO2008/111511
PCT Pub. Date: Sep. 18, 2008

(65) Prior Publication Data
US 2010/0118971 A1 May 13, 2010

(30) Foreign Application Priority Data
Mar. 14, 2007 (JP) ................. 2007-064283

(51) Int. Cl.
*H04N 7/12* (2006.01)
*H03M 7/30* (2006.01)
(Continued)

(52) U.S. Cl.
CPC ............ *H03M 7/30* (2013.01); *H04N 19/124* (2014.11); *H04N 19/129* (2014.11); *H04N 19/13* (2014.11);
(Continued)

(58) Field of Classification Search
CPC ....... H03M 7/30; H04N 7/12; H04N 19/197; H04N 19/176; H04N 19/196; H04N 19/93; H04N 19/149; H04N 19/129; H04N 19/61; H04N 19/124; H04N 19/13

USPC ........ 375/240.04, 240.23; 348/699; 382/246; 717/136; 341/50
See application file for complete search history.

(56) References Cited

U.S. PATENT DOCUMENTS 5,086,488 A 2/1992 Kato et al.
5,283,646 A 2/1994 Bruder
(Continued)

FOREIGN PATENT DOCUMENTS

CN 1713733 A 12/2005
EP 0 424 060 A2 4/1991
(Continued)

OTHER PUBLICATIONS

Lu, Xiaoan, et al., "Fast Mode Decision and Motion Estimation for H.264 with a Focus on MPEG-2/H.264 Transcoding," Conference Proceedings, IEEE International Symposium on Circuits and Systems (ISCAS), May 23, 2005, pp. 1246-1249.
(Continued)

*Primary Examiner* — Y Lee
*Assistant Examiner* — Richard Carter
(74) *Attorney, Agent, or Firm* — Harness, Dickey & Pierce, P.L.C.

(57) ABSTRACT

In a code amount estimating method, when encoding quantized values of coefficients of a larger-sized orthogonal transformation than an orthogonal transformation size assigned to a variable length encoding table, the quantized values are rearranged in a one-dimensional form, so as to obtain run-level sets. The number of groups is computed based on a proportion between an orthogonal transformation area corresponding to the orthogonal transformation size assigned to the variable length encoding table and an orthogonal transformation area for an encoding target. The Run-Level sets are classified into groups having the number of groups. Each Run is divided by the number of groups, and the obtained quotient is set as Run. A code length of each Run-Level set in each group is determined by referring to the variable length encoding table. The amount of generated code is estimated to be the total sum of the code lengths of all groups.

5 Claims, 17 Drawing Sheets

(51) Int. Cl.

| | | |
|---|---|---|
| *H04N 19/196* | (2014.01) | |
| *H04N 19/176* | (2014.01) | |
| *H04N 19/13* | (2014.01) | |
| *H04N 19/149* | (2014.01) | |
| *H04N 19/129* | (2014.01) | |
| *H04N 19/61* | (2014.01) | |
| *H04N 19/124* | (2014.01) | |
| *H04N 19/93* | (2014.01) | |

(52) U.S. Cl.
CPC ......... *H04N 19/149* (2014.11); *H04N 19/176* (2014.11); *H04N 19/196* (2014.11); *H04N 19/197* (2014.11); *H04N 19/61* (2014.11); *H04N 19/93* (2014.11)

(56) References Cited

U.S. PATENT DOCUMENTS

| | | | |
|---|---|---|---|
| 5,398,068 A | 3/1995 | Liu et al. | |
| 5,398,078 A * | 3/1995 | Masuda | H04N 19/176 348/699 |
| 5,760,836 A | 6/1998 | Greenfield et al. | |
| 5,781,237 A * | 7/1998 | Fukuda | 375/240.04 |
| 5,832,128 A * | 11/1998 | Suzuki | 382/246 |
| 5,835,145 A | 11/1998 | Ouyang et al. | |
| 6,148,029 A | 11/2000 | Fert | |
| 6,173,012 B1 | 1/2001 | Katta et al. | |
| 6,414,995 B2 | 7/2002 | Okumura et al. | |
| 6,480,544 B1 | 11/2002 | Uehara et al. | |
| 6,498,810 B1 | 12/2002 | Kim et al. | |
| 6,546,050 B2 | 4/2003 | Ramaswamy | |
| 6,567,554 B1 | 5/2003 | Sugahara et al. | |
| 6,798,837 B1 | 9/2004 | Uenoyama et al. | |
| 6,859,496 B1 | 2/2005 | Boroczky et al. | |
| 6,963,608 B1 | 11/2005 | Wu | |
| 7,042,943 B2 | 5/2006 | Haskell et al. | |
| 7,197,072 B1 | 3/2007 | Hsu et al. | |
| 7,953,154 B2 | 5/2011 | Murakami et al. | |
| 8,634,458 B2 | 1/2014 | Ishii | |
| 2002/0122482 A1 | 9/2002 | Kim et al. | |
| 2003/0043917 A1 | 3/2003 | Bublil et al. | |
| 2003/0095594 A1 | 5/2003 | Laksono et al. | |
| 2003/0112872 A1 | 6/2003 | Park et al. | |
| 2004/0120404 A1 * | 6/2004 | Sugahara | G10L 19/24 375/240.23 |
| 2004/0126028 A1 | 7/2004 | Adachi et al. | |
| 2004/0197024 A1 | 10/2004 | Bobichon et al. | |
| 2005/0036698 A1 | 2/2005 | Beom | |
| 2005/0063468 A1 | 3/2005 | Shimizu et al. | |
| 2005/0066318 A1 * | 3/2005 | Chujoh et al. | 717/136 |
| 2005/0078748 A1 | 4/2005 | Moni et al. | |
| 2005/0152450 A1 | 7/2005 | Ueno et al. | |
| 2005/0159946 A1 | 7/2005 | Chen et al. | |
| 2005/0175093 A1 | 8/2005 | Haskell et al. | |
| 2005/0207493 A1 | 9/2005 | Kobayakawa | |
| 2005/0243930 A1 | 11/2005 | Asano et al. | |
| 2006/0072666 A1 | 4/2006 | Cho et al. | |
| 2006/0126732 A1 | 6/2006 | Pian et al. | |
| 2006/0153293 A1 | 7/2006 | Hsu et al. | |
| 2006/0159357 A1 | 7/2006 | Mizuno | |
| 2006/0171457 A1 | 8/2006 | DeGarrido et al. | |
| 2006/0176953 A1 | 8/2006 | Mohsenian | |
| 2006/0209965 A1 | 9/2006 | Tseng | |
| 2006/0222074 A1 | 10/2006 | Zhang | |
| 2006/0251172 A1 | 11/2006 | Kim | |
| 2007/0009045 A1 | 1/2007 | Mohandas | |
| 2007/0071094 A1 | 3/2007 | Takeda et al. | |
| 2007/0296613 A1 * | 12/2007 | Hussain | H04N 19/61 341/50 |
| 2009/0168884 A1 | 7/2009 | Lu et al. | |
| 2010/0014583 A1 | 1/2010 | Shimizu et al. | |

FOREIGN PATENT DOCUMENTS

| | | |
|---|---|---|
| EP | 0 757 490 A2 | 2/1997 |
| EP | 0 773 688 A2 | 5/1997 |
| EP | 1032213 A2 | 8/2000 |
| EP | 1120976 A1 | 8/2001 |
| EP | 1182888 A2 | 2/2002 |
| EP | 1 274 253 A2 | 1/2003 |
| EP | 1662801 A1 | 5/2006 |
| JP | 04-150284 A | 5/1992 |
| JP | 04-298184 A | 10/1992 |
| JP | 05-328333 A | 12/1993 |
| JP | 6-113271 A | 4/1994 |
| JP | 6-237448 A | 8/1994 |
| JP | 7-203430 A | 8/1995 |
| JP | 7-0264579 | 10/1995 |
| JP | 08-009379 A | 1/1996 |
| JP | 08-9379 A | 1/1996 |
| JP | 08-009397 A | 1/1996 |
| JP | 8-116448 A | 5/1996 |
| JP | 9-098427 A | 4/1997 |
| JP | 10-126792 A | 5/1998 |
| JP | 10-290461 A | 10/1998 |
| JP | 11-55671 A | 2/1999 |
| JP | 11-196424 A | 7/1999 |
| JP | 11-239354 | 8/1999 |
| JP | 11-252572 A | 9/1999 |
| JP | 2000-023162 A | 1/2000 |
| JP | 2000-138938 A | 5/2000 |
| JP | 2000-201328 A | 7/2000 |
| JP | 2000-244921 A | 9/2000 |
| JP | 2000-261799 A | 9/2000 |
| JP | 2002-010260 A | 1/2002 |
| JP | 2002-247587 | 8/2002 |
| JP | 2004-64725 A | 2/2004 |
| JP | 2004-134896 A | 4/2004 |
| JP | 2004-166088 A | 6/2004 |
| JP | 2005-45736 A | 2/2005 |
| JP | 2005-073245 A | 3/2005 |
| JP | 2005-102170 A | 4/2005 |
| JP | 2005-295526 A | 10/2005 |
| JP | 2005-318296 A | 11/2005 |
| JP | 2005-318468 A | 11/2005 |
| JP | 2006-005466 A | 1/2006 |
| JP | 2006-506032 A | 2/2006 |
| JP | 2006-203437 A | 8/2006 |
| JP | 2006-270683 | 10/2006 |
| JP | 2006-295535 A | 10/2006 |
| RU | 2 123 769 C1 | 12/1998 |
| RU | 2 127 962 C1 | 3/1999 |
| RU | 2 137 194 C1 | 9/1999 |
| RU | 2 210 817 C2 | 8/2003 |
| RU | 2 277 761 C2 | 7/2004 |
| RU | 2004 125 588 A | 1/2006 |
| SU | 1649674 A1 | 5/1991 |
| TW | I256259 B | 6/2006 |
| TW | 200629911 A | 8/2006 |
| TW | 200704203 A | 1/2007 |
| WO | WO-01/10135 A1 | 2/2001 |
| WO | 03/084242 A2 | 10/2003 |
| WO | WO-2006/006564 A1 | 1/2006 |
| WO | 2006/096869 A2 | 9/2006 |

OTHER PUBLICATIONS

Wiegand, Thomas, et al., "Overview of the H.264/AVC Video Coding Standard," IEEE Transactions on Circuits and Systems for Video Technology, vol. 13, No. 7, Jul. 2003, pp. 560-576.

Sakae Okubo, Shinya Kadono, Yoshihiro Kikichi, and Teruhiko Suzuki, "H.264/AVC Textbook", Impress, pp. 144-146, 2004.

CABAC: Detlev Marpe, Heiko Schwarz, Thomas Wiegand, "Context-Based Adaptive Binary Arithmetic Coding in the H.264/AVC Video Compression Standard", IEEE Transactions on Circuits and Systems for Video Technology, vol. 13, No. 7, pp. 620-636, Jul. 2003.

MPEG-2, Test Model 5 (TM5), Doc.ISO/IECJTC1/SC29/WG11/ NO400, Test Model Editing Committee, pp. 59-63, Apr. 1993. http://iphome.hhi.de/suehring/tml/download/ on the Internet.

(56) References Cited

OTHER PUBLICATIONS

ISO/IEC-13818-2, "Information technology—Generic coding of moving pictures and associated audio information: Video", pp. 77-85, May 1996.
ITU-T H.264 ITU-T Rec. H.264, "Advanced video coding for generic audiovisual services", pp. 146-149, Mar. 2005.
Edited by The Institute of Television Engineers of Japan, Sogo Multimedia Sensho MPEG, 1st edition, Ohmsha, Ltd., Apr. 20, 1996, pp. 110 to 113, 5-5 Rate Seigyo to Buffer Seigyo 1 Bit Haibun, Rate Seigyo to Tekioryosika (1) Step 1.
Sullivan, Gary J., et al., "Rate-Distortion Optimization for Video Compression," IEEE Signal Processing Magazine, Nov. 1998, pp. 74-90, vol. 15, No. 6.
Vetro, Anthony, et al., "MPEG-4 Rate Control for Multiple Video Objects," IEEE Transactions on Circuits and Systems for Video Technology, Feb. 1999, pp. 186-199, vol. 9, No. 1.
Yin, Ming, et al., "A Rate Control Scheme for H.264 Video Under Low Bandwidth Channel," Journal of Zhejiang University Science A, Jun. 2006, pp. 990-995, vol. 7, No. 6.
Richardson, Iain, "H.264 and MPEG-4 Video Compression: Video Coding for Next Generation," Moscow: Tekhnosfera, 2005, pp. 55-65, 228-240 (pp. 33-42, 172-184 of translation).
Yi, Xiaoquan, et al., "Improved and simplified fast motion estimation for JM," Joint Video Team (JVT) of ISO/IEC MPEG & ITU-T VCEG, JVT-P021, 16th Meeting: Poznan, Poland, Jul. 24-29, 2005, pp. 1-23.
Richardson, Iain, "H.264 and MPEG-4 Video Compression: Video Coding for Next Generation," Moscow: Tekhnosfera, 2005, pp. 261-269 (pp. 201-207 of translation).
Adachi, S., et al., CAVLC Cleanup to Accommodate ABT including Field Scans Joint Video Team (JVT) of ISO/IEC MPEG & ITU-T VCEG (ISO/IEC JTC1/SC29/WG11 and ITU-T SG16 Q.6), 5th Meeting, Geneva, Switzerland, Oct. 9-17, 2002 (Oct. 9, 2002), pp. 1-4, XP002339408.
Fujita, Gen, et al., "Real-time Processing Method for H.264 CABAC Using low Clock Frequency," IEICE Technical Report, The Institute of Electronics, Information and Communication Engineers, vol. 106, No. 116, Jun. 16, 2006, pp. 19-23.
Notification to Grant Patent Right for Invention, Chinese Patent Application No. 200880007031.2, Dec. 4, 2014.
Office Action, U.S. Appl. No. 12/528,879, Aug. 11, 2014.
Chang, Chih-Feng, et al., "A Stable Buffer Control Strategy for MPEG Coding," IEEE Transactions on Circuits and Systems for Video Technology, vol 7, No. 6, pp. 920-924, Dec. 1997.

\* cited by examiner

EXAMPLE 1 OF FOUR-GROUP CLASSIFICATION

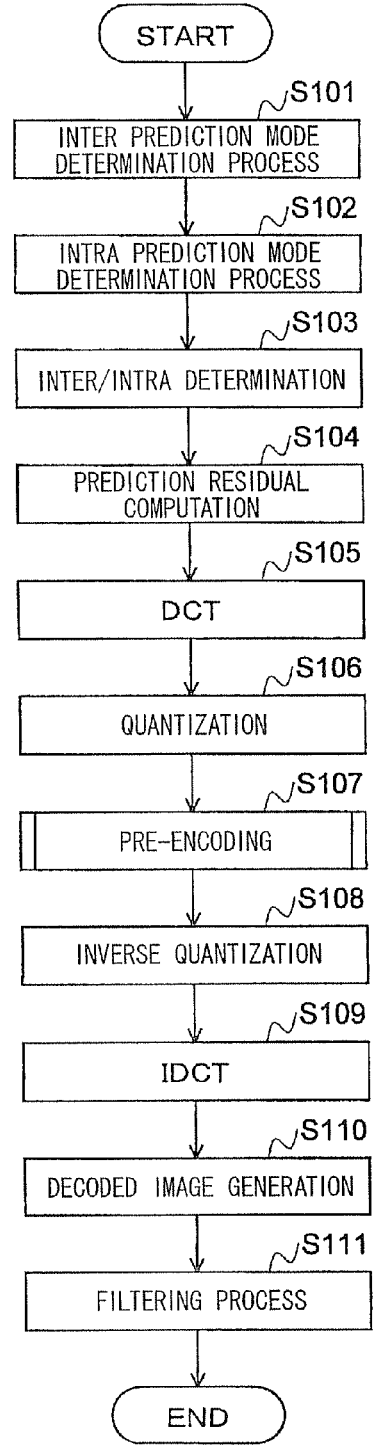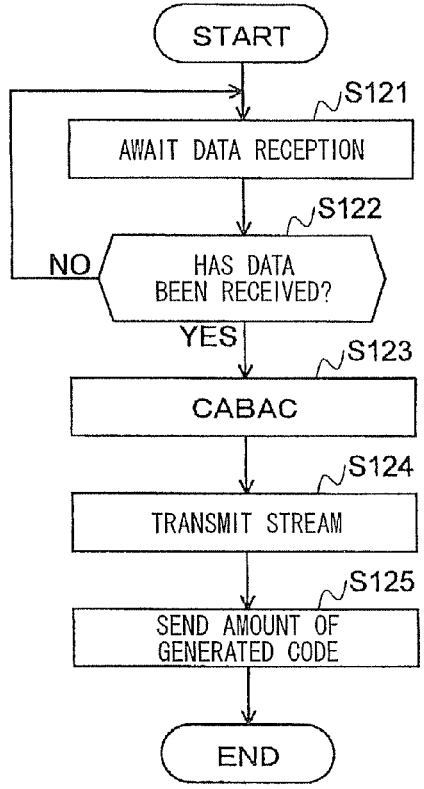
FIG. 7A (PRIOR ART)
FIG. 7B (PRIOR ART)

FIG. 9 (PRIOR ART)

SCANNING ORDER OF 4×4 BLOCK

| 0 | 1  | 5  | 6  |
|---|----|----|----|
| 2 | 4  | 7  | 12 |
| 3 | 8  | 11 | 13 |
| 9 | 10 | 14 | 15 |

FIG. 10 (PRIOR ART)

|   |   |   |   |
|---|---|---|---|
| 5 | 3 | 2 | 0 |
| 0 | 0 | 1 | −1 |
| 0 | 0 | 0 | 0 |
| 0 | 0 | 0 | 0 |

⇩ ONE-DIMENSIONAL ARRANGEMENT 5, 3, 0, 0, 0, 2, 0, 1, 0, 0, 0, 0, −1, 0, 0, 0

⇩

| RUN | LEVEL |
|-----|-------|
| 0   | 5     |
| 0   | 3     |
| 3   | 2     |
| 1   | 1     |
| 4   | −1    |

FIG. 14 (PRIOR ART)

SCANNING ORDER OF CABAC

| 0  | 1  | 5  | 6  | 14 | 15 | 27 | 28 |
|----|----|----|----|----|----|----|----|
| 2  | 4  | 7  | 13 | 16 | 26 | 29 | 42 |
| 3  | 8  | 12 | 17 | 25 | 30 | 41 | 43 |
| 9  | 11 | 18 | 24 | 31 | 40 | 44 | 53 |
| 10 | 19 | 23 | 32 | 39 | 45 | 52 | 54 |
| 20 | 22 | 33 | 38 | 46 | 51 | 55 | 60 |
| 21 | 34 | 37 | 47 | 50 | 56 | 59 | 61 |
| 35 | 36 | 48 | 49 | 57 | 58 | 62 | 63 |

FIG. 15 (PRIOR ART)

SCANNING ORDER OF CAVLC

| A0 | B0 | B1 | C1 | C3 | D3 | D6 | A7 |
|----|----|----|----|----|----|----|----|
| C0 | A1 | D1 | B3 | A4 | C6 | B7 | C10 |
| D0 | A2 | A3 | B4 | B6 | C7 | B10 | D10 |
| B2 | D2 | C4 | A6 | D7 | A10 | A11 | B13 |
| C2 | D4 | D5 | A8 | D9 | B11 | A13 | C13 |
| A5 | C5 | B8 | C9 | C11 | D12 | D13 | A15 |
| B5 | C8 | B9 | D11 | C12 | A14 | D14 | B15 |
| D8 | A9 | A12 | B12 | B14 | C14 | C15 | D15 |

CODE AMOUNT ESTIMATING METHOD AND APPARATUS, AND PROGRAM AND STORAGE MEDIUM THEREFOR

TECHNICAL FIELD

The present invention relates to a code amount estimating method and corresponding apparatus, program, and storage medium in video encoding in which a video image is subjected to orthogonal transformation and encoding using variable length code.

Priority is claimed on Japanese Patent Application No. 2007-064283, filed Mar. 14, 2007, the contents of which are incorporated herein by reference.

BACKGROUND ART

In most of recent video encoding methods, each frame is divided into small areas, and a differential image based on a predicted image is subjected to orthogonal transformation, quantization, and then entropy encoding, thereby compressing video data.

In H.264 video coding standard (see Non-Patent Document 1) as a current mainstream video coding format, not only a context-adaptive variable length coding ("CAVLC") method for performing entropy encoding by referring to a table, but also a context-adaptive binary arithmetic coding ("CABAC") method which can further improve the encoding efficiency can be selected.

The above CABAC is a coding method which can compress a stationary signal to a logical limit, and thus is an essential technique for highly efficient encoding. However, in comparison with CAVLC, the computation cost of CABAC is very high (see Non-Patent Document 2).

When encoding a video image and generating a stream which may be distributed on a network having a limited transmission band, it is necessary to produce a constant amount of generated code per unit time so as not to exceed the limited band. Generally, rate control for controlling the amount of generated code by varying the quantization step size ("$Q_{step}$") is executed.

For example, each encoding target block is encoded; the corresponding amount of generated code is computed; and $Q_{step}$ of the next block is adjusted based on the computed result, thereby keeping a constant amount of generated code.

When using CABAC, a considerable amount of time is required for obtaining the amount of generated code, which increases a delay in encoding. In a known proposed method for reducing the delay, the relationship between $Q_{step}$ and the amount of generated code is approximated using a function, so as to estimate the amount of generated code (see Patent Document 1).

However, using an approximate function produces a variation in measurement accuracy depending on each video image. In order to perform estimation with an improved accuracy, CAVLC having a smaller computation cost than CABAC may be used for estimating the amount of code (i.e., code amount estimation). In such a case, a result obtained by performing variable length encoding is used, and thus a higher code amount estimation can be executed.

FIGS. 7A and 7B show a flowchart of an encoding operation by which CAVLC can be used for code amount estimation of CABAC. Here, FIG. 7A shows a main routine, and FIG. B shows a CABAC process.

First, the main routine (steps S101 to S111) in FIG. 7A will be explained.

The inter prediction mode and the intra prediction mode are first determined (see steps S101 and S102).

Next, the prediction mode is determined by performing intra/inter determination (see step S103), and a prediction residual is computed for the determined mode (see step S104) and is subjected to DCT (see step S105).

Quantization is applied to DCT transform coefficients by using a supplied $Q_{step}$ (see step S106).

The quantized transform coefficients are arranged in a one-dimensional form, and coefficient information is supplied to a CABAC computation unit. Simultaneously, code amount estimation is performed based on the coefficient information (pre-encoding process) (see step S107).

The quantized coefficients are also subjected to inverse quantization (see step S108) and IDCT (see step S109), and are then added to a predicted image, thereby generating a decoded image (see step S110).

Finally, the decoded image is subjected to a filtering process (see step S111).

Next, the CABAC process (see steps S121 to S125) in FIG. 7B will be explained.

First, reception of coefficient information generated in the pre-encoding process (S107) is being awaited (see steps S121 to S122). When the relevant data is received, a CABAC step is performed (see step S123), and a generated stream is transmitted (see step S124). Finally, the amount of generated code is sent to a code amount controller (see step S125).

FIG. 8 shows an example of the structure for implementing the above operation.

The shown apparatus has an inter prediction mode determination unit 101, an intra prediction mode determination unit 102, a prediction mode selector 103, a switch 104, a subtractor 105, a DCT unit 106, a quantizer 107, a code amount controller 108, a pre-encoding processor 109, an entropy encoder 110, an inverse quantizer 111, an IDCT unit 112, an adder 113, a decoded image storage buffer 114, a filter 115, and a reference image storage buffer 116.

The inter prediction mode determination unit 101 performs motion-compensated prediction using a reference image in the reference image storage buffer 116, determines the inter prediction mode, sends prediction mode information to the prediction mode selector 103, and also sends a predicted image to the switch 104.

The intra prediction mode determination unit 102 determines the intra prediction mode by using a decoded image in the decoded image storage buffer 114, sends prediction mode information to the prediction mode selector 103, and also sends a predicted image to the switch 104.

The prediction mode selector 103 determines the prediction mode, and selects one of the intra prediction mode and the inter prediction mode by sending a control signal to the switch 104.

Based on the control signal from the prediction mode selector 103, the switch 104 selects one of an inter predicted image sent from the inter prediction mode determination unit 101 and an intra predicted image sent from the intra prediction mode determination unit 102.

The subtractor 105 generates a predicted residual image by computing the difference between an original image and a predicted image, and sends the generated image to the DCT unit 106.

The DCT unit 106 applies DCT transform to the sent predicted residual image, and sends the image to the quantizer 107.

The quantizer 107 performs quantization of the DCT transform coefficients by using the quantization step size $Q_{step}$ sent from the code amount controller 108, and sends the quantized result to the pre-encoding processor 109 and the inverse quantizer 111.

Based on an estimated amount of code (estimated code amount) sent from the pre-encoding processor 109, the code amount controller 108 computes $Q_{step}$ of the next macroblock, and sends the computed $Q_{step}$ to the quantizer 107 and the inverse quantizer 111. The code amount controller 108 also receives the amount of generated code sent from the entropy encoder 110, and corrects the difference from the estimated amount of code.

The pre-encoding processor 109 computes the estimated amount of code based on the quantized DCT coefficients sent from the quantizer 107, and sends the computed value to the code amount controller 108. The pre-encoding processor 109 also generates coefficient information by arranging the quantized DCT coefficients (two-dimensional data) in a one-dimensional form, and sends the generated information to the entropy encoder 110.

The entropy encoder 110 encodes the coefficient information, which is sent from the pre-encoding processor 109, by means of CABAC, and outputs the encoded data as an encoded stream.

The inverse quantizer 111 performs inverse quantization by multiplying the relevant quantized value by $Q_{step}$, and sends the result to the IDCT unit 112.

The IDCT unit 112 applies IDCT to the received data, and sent the result to the adder 113.

The adder 113 adds the predicted residual image sent from the IDCT unit 112 to the predicted image sent from the switch 104, and sends the result as a decoded image to the decoded image storage buffer 114.

The decoded image storage buffer 114 stores the decoded image sent from the adder 113, and sends the image to the filter 115. The decoded image storage buffer 114 also sends adjacent pixel information to the intra prediction mode determination unit 102.

The filter 115 applies a filtering process to the decoded image stored in the decoded image storage buffer 114, and sends the filtered image to the reference image storage buffer 116.

The reference image storage buffer 116 stores the filtered decoded image, and sends the image as a reference image to the inter prediction mode determination unit 101.

In accordance with the above functions, the operation shown in FIGS. 7A and 7B is implemented.

Below, the pre-encoding processor 109, to which the present invention can be applied, will be explained.

The pre-encoding processor 109 arranges the two-dimensional data of the quantized DCT coefficients in a one-dimension form, generates coefficient information, sends the information to the entropy encoder 110, and estimates the amount of code by referring to a table.

First, the method of generating coefficient information from two-dimensional data will be explained.

In an example in which the DCT coefficients have a 4×4 block form, the coefficients are arranged in a one-dimensional form in the order as shown in FIG. 9, and the coefficient values are sequentially examined from the 0-th coefficient so that the number of successive coefficients having a value of 0 and the coefficient (non-zero coefficient) which follows the coefficients and has a value other than 0 are stored as a set. Here, the number of successive "0" coefficients is called Run and the coefficient other than 0 is called Level. Such an operation of scanning the coefficient values in a zigzag form so as to arrange them in a one-dimensional form and convert them into Run-Level data is called "zigzag scanning".

A specific example is shown in FIG. 10, where no "0" exists before coefficients "5" and "3", and 0 (as Run) is assigned to them.

Additionally, in the table reference in H.264, not only Run and Level, but also (i) the number of the non-zero coefficients and (ii) the number of final succession of "1" or "−1" coefficients and the relevant sign are necessary. Based on the necessary data, the amount of code is estimated by referring to a table. In addition, the Run-Level information is encoded by means of arithmetic encoding.

FIG. 11 shows an example of a flowchart of the above operation.

First, zigzag scanning of the relevant 4×4 block is performed, and the Run-Level sets are obtained (see step S151). The results are sent to the entropy encoder 110 (see step S152).

For the obtained Run-Level sets, the number of non-zero coefficients, the number of final succession of "1" or "−1" coefficients, and the positive or negative sign therefor are determined (see step S153), and the relevant amount of code is computed using a variable-length coding table (called a "VLC table") (see step S154).

The computed amount of code is sent as an estimated amount of code (estimated code amount) to the code amount controller 108 (see step S155).

FIG. 12 shows a flowchart of zigzag scanning.

First, counters i and n are each initialized at 0 (see step S201). Additionally, the variable "run" is also initialized at 0 (see step S202).

Next, coordinates S_i(x, y) of the i-th coefficient in scanning are obtained by referring to a table, and the coefficient value at the obtained coordinates is stored into k[i] (see step S204). In an example of processing a 4×4 block, the coefficients are subsequently input into k[i] in the order shown in FIG. 9.

If k[i]=0 (see step S205), run is incremented by 1 (see step S206), and i is also incremented by 1 (see step S209).

If k[i] is not zero (see step S205), the value of run is stored in Run[n] for storing Run information, and the non-zero coefficient k[i] is stored in Level[n] for storing Level information (see step S207). Then i is incremented by 1 (see step S209).

When the scanning has reached the last coefficient, the operation is completed (see step S210). When the scanning has not yet reached the last coefficient, the above process from step S203 to S210 is repeated.

In accordance with the above operation, the Run-Level sets can be obtained by means of zigzag scanning.

FIG. 13 shows an example of the structure of the pre-encoding processor 109 in FIG. 8.

The structure includes a quantized value storage buffer 201, a run counter 202, a pre-encoding process controller 203, a 4×4 scanning counter 204, a 4×4 scanning order reference table 205, a Run-Level information storage buffer 206, a code amount estimation controller 207, a code amount estimation unit 208, and a VLC table storage memory 209.

The quantized value storage buffer 201 stores the quantized (values of) DCT coefficients. When receiving coordinate information from the 4×4 scanning order reference table 205, the quantized value storage buffer 201 sends the quantized value corresponding to the relevant coordinates to the run counter 202. When the quantized value is received, the quantized value storage buffer 201 sends an operation start signal to the pre-encoding process controller 203.

The run counter 202 stores variable "run" and receives the quantized value from the quantized value storage buffer 201. When the received quantized value is 0, the run counter 202 increments run by 1. When the received quantized value is not 0, the run counter 202 sends the relevant coefficient and the currently-stored Run to the Run-Level information storage buffer 206 as Run-Level information, and resets run to 0. The run counter 202 also resets run to 0 when receiving a reset signal from the pre-encoding process controller 203.

When the pre-encoding process controller 203 receives a start signal from the quantized value storage buffer 201, the pre-encoding process controller 203 sends a reset signal to the run counter 202 and the Run-Level information storage buffer 206 so as to reset them, and then sends an operation start signal to the 4×4 scanning counter 204. In addition, when receiving an end signal from 4×4 scanning counter 204, the pre-encoding process controller 203 sends an estimation start signal to the code amount estimation controller 207.

When receiving the operation start signal from the pre-encoding process controller 203, the 4×4 scanning counter 204 sequentially sends numeric values from 0 to 15 to the 4×4 scanning order reference table 205. When the last "15" has been sent, the 4×4 scanning counter 204 sends an end signal to the pre-encoding process controller 203.

The 4×4 scanning order reference table 205 receives coordinates corresponding to the numeric values from the 4×4 scanning counter 204, and sends the coordinates to the quantized value storage buffer 201.

When receiving Run-Level information from the run counter 202, the Run-Level information storage buffer 206 stores the information, and sends it to the code amount estimation unit 208 in accordance with a control signal from the code amount estimation controller 207. The Run-Level information storage buffer 206 also sends the Run-Level information to the entropy encoder 110. Additionally, when receiving a reset signal from the pre-encoding process controller 203, the Run-Level information storage buffer 206 clears the contents of the buffer.

When the code amount estimation controller 207 receives an estimation start signal from the pre-encoding process controller 203, the code amount estimation controller 207 sends an estimation start signal to the code amount estimation unit 208, and also sends a control signal to the Run-Level information storage buffer 206 so as to send Run-Level information to the code amount estimation unit 208.

When receiving the estimation start signal from the code amount estimation controller 207, the code amount estimation unit 208 receives VLC information from the VLC table storage memory 209 based on the Run-Level information sent from the Run-Level information storage buffer 206, and estimates and outputs an amount of code.

The VLC table storage memory 209 stores a VLC table, and sends it as the VLC information to the code amount estimation unit 208.

In accordance with the above structure, the operation as shown in FIG. 11 can be implemented.

Non-Patent Document 1: Sakae Okubo, Shinya Kadono, Yoshihiro Kikuchi, and Teruhiko Suzuki, "H.264/AVC TEXTBOOK", Impress, pp. 144-146, 2004

Non-Patent Document 2: CABAC: Detlev Marpe, Heiko Schwarz, Thomas Wiegand, "Context-Based Adaptive Binary Arithmetic Coding in the H.264/AVC Video Compression Standard", IEEE TRANSACTIONS ON CIRCUITS AND SYSTEMS FOR VIDEO TECHNOLOGY, Vol. 13, No. 7, pp. 620-636, July 2003

Patent Document 1: Japanese Unexamined Patent Application, First Publication No. H07-264579

DISCLOSURE OF INVENTION

Problem to be Solved by the Invention

Even when a plurality of sizes for orthogonal transformation are selectable, variable length encoding tables corresponding to all sizes are not always prepared. That is, no variable length encoding table corresponding to a large-sized orthogonal transformation may not be prepared, and a variable length encoding table corresponding to a small-sized orthogonal transformation may be also assigned to the large-sized orthogonal transformation.

Accordingly, in a video encoding system having a plurality of selectable variable length encoding methods, the Run-Level generation method may be changed depending on the variable length encoding method even with the same orthogonal transformation size. In such a case, the amount of code required in a variable length encoding having a high computation cost may be estimated using a variable length encoding having a low computation cost, and such estimation may increase the computation cost.

For example, in H.264, not only 4×4 DCT but also 8×8 DCT can be used. FIG. 14 shows a scanning order employed when encoding quantization coefficients of 8×8 DCT by means of CABAC. As understood by FIG. 14, a zigzag scanning from 0 to 63 is performed so as to determine Run and Level.

In contrast, when encoding the quantization coefficients of 8×8 DCT by means of CAVLC, there is no exclusive variable length encoding table for 8×8 DCT, and the encoding target is divided into four parts so as to use a variable length encoding table prepared for 4×4 DCT. Therefore, when the encoding of 8×8 DCT is performed using CAVLC, scanning, whose order completely differs from that of CABAC, is executed four times, and thus four divided and pseudo 4×4 DCT coefficients should be set.

FIG. 15 shows a scanning order of CAVLC. The 64 (8×8) coefficients are classified into four groups (A0 to A15; B0 to B15; C0 to C15; and D0 to D15) and are processed.

In FIG. 15, a first block from A0 to A15, a second block from B0 to B15, a third block from C0 to C15, and a fourth block from D0 to D15 are sequentially scanned, that is, scanning is executed four times. After setting four divided blocks, the amount of code required for each set of 4×4 DCT coefficients of four blocks is computed by referring to a VLC table for 4×4 DCT, and the total cost is then computed.

Therefore, when using CAVLC for estimating the amount of code required in CABAC encoding, four times scanning independent of CABAC must be executed, which increases the computation cost.

FIG. 16 shows an example of an operation flow of a conventional method executed by the pre-encoding processor 109 for 8×8 DCT.

First, the estimated amount Rate of code is initialized at 0 (see step S301). Then, zigzag scanning is performed for actual encoding (see step S302). This step is performed similar to the flow in FIG. 12, and the scanning order reference table returns coordinates in the order shown in FIG. 14. The obtained Run-Level information is sent to the entropy encoder 110 (see step S303).

Next, the process of estimating the amount of code is performed.

First, loop counter i is initialized at 0 (see step S304), and scanning of the first (0-th) block is performed (see step S305). This step is performed similar to the flow in FIG. 12, and the scanning order reference table returns the coordinates at A0 to A15 in FIG. 15.

Based on obtained Run-Level information, the number of non-zero coefficients, the number of final succession of "1" or "−1" coefficients, and the positive or negative sign of the succession are computed (see step S306), and the amount of code is computed using a VLC table (see step S307).

The computed amount of code is added to Rate (see step S308), i is incremented by 1 (see step S310), and the second block is subjected to an operation similar to the above (see steps S305 to S310), where the scanning order reference table returns the coordinates at B0 to B15 in FIG. 15.

Then, C0 to C15 and D0 to D15 are each subjected to an operation similar to the above (see steps S305 to S310), and finally, the value of estimated amount Rate of code is transmitted (see step S311).

FIG. 17 shows an example of the structure which implements the above operation.

The structure includes an 8×8 quantized value storage buffer 301, a run counter 302, a pre-encoding process controller 303, an 8×8 scanning counter 304, an 8×8 scanning order reference table 305, a 4×4 scanning counter 306, a switch "A" 307, a 4×4 scanning order reference table "a" 308, a 4×4 scanning order reference table "b" 309, a 4×4 scanning order reference table "c" 310, a 4×4 scanning order reference table "d" 311, a Run-Level information storage buffer 312, an 8×8 code amount estimation controller 313, a code amount estimation unit 314, a VLC table storage memory 315, and an estimated code amount computation unit 316.

Among the above structural elements, the run counter 302, the pre-encoding process controller 303, the 4×4 scanning counter 306, the Run-Level information storage buffer 312, the code amount estimation unit 314, and the VLC table storage memory 315 have the same functions as those of the above-described structural elements having the same names.

The 8×8 quantized value storage buffer 301 stores the quantized values of the 8×8 DCT coefficients. When receiving coordinate information from the 8×8 scanning order reference table 305 and the 4×4 scanning order reference tables "a" 308, "b" 309, "c" 310, and "d" 311, the 8×8 quantized value storage buffer 301 sends the quantized values stored at the corresponding coordinates to the run counter 302.

When the 8×8 scanning counter 304 receives an operation start signal from the pre-encoding process controller 303, the 8×8 scanning counter 304 sequentially sends numerical values 0 to 63 to the 8×8 scanning order reference table 305.

The 8×8 scanning order reference table 305 sends coordinates corresponding to each numerical value (sent from the 8×8 scanning counter 304) to the 8×8 quantized value storage buffer 301.

The switch "A" 307 performs switching between terminals a to d based on a control signal sent from the 4×4 scanning counter 306.

The 4×4 scanning order reference table "a" 308 sends coordinates corresponding to each numeric value (sent from the 4×4 scanning counter 306) to the 8×8 quantized value storage buffer 301. The coordinates correspond to A0 to A15 in FIG. 15.

The 4×4 scanning order reference table "b" 309 sends coordinates corresponding to each numeric value (sent from the 4×4 scanning counter 306) to the 8×8 quantized value storage buffer 301. The coordinates correspond to B0 to B15 in FIG. 15.

The 4×4 scanning order reference table "c" 310 sends coordinates corresponding to each numeric value (sent from the 4×4 scanning counter 306) to the 8×8 quantized value storage buffer 301. The coordinates correspond to C0 to C15 in FIG. 15.

The 4×4 scanning order reference table "d" 311 sends coordinates corresponding to each numeric value (sent from the 4×4 scanning counter 306) to the 8×8 quantized value storage buffer 301. The coordinates correspond to D0 to D15 in FIG. 15.

When the 8×8 code amount estimation controller 313 receives an estimation start signal from the pre-encoding process controller 303, the 8×8 code amount estimation controller 313 sends a control signal to the switch "A" 307 so as to select terminal a of the switch, and then sends a start signal to the 4×4 scanning counter 306.

When receiving an end signal from the 4×4 scanning counter 306, the 8×8 code amount estimation controller 313 sends an estimation start signal to the code amount estimation unit 314, and sends a control signal to the Run-Level information storage buffer 312 so as to supply Run-Level information to the code amount estimation unit 314.

The 8×8 code amount estimation controller 313 then sends a control signal to the switch "A" 307 so as to select terminal b of the switch, and then sends a start signal to the 4×4 scanning counter 306.

When receiving an end signal from the 4×4 scanning counter 306, the 8×8 code amount estimation controller 313 sends an estimation start signal to the code amount estimation unit 314, and also sends a control signal to the Run-Level information storage buffer 312 so as to supply Run-Level information to the code amount estimation unit 314.

After that, the terminal of the switch "A" 307 is switched to c, and then d, so as to perform operations similar to those explained above.

When the estimated code amount computation unit 316 receives an estimated amount of code from the code amount estimation unit 314, the estimated code amount computation unit 316 performs addition of the received value. That is, after adding the relevant four amounts of code, the estimated code amount computation unit 316 transmits the sum of them as an estimated amount of code. Additionally, when receiving a reset signal from the pre-encoding process controller 303, the estimated code amount computation unit 316 resets the stored value to 0.

In accordance with the above structure, the operation shown in FIG. 16 can be implemented.

However, scanning must be executed five times as explained above, the amount of processing increases, and the structure is complex.

The techniques relating to the present invention and problems of the conventional techniques, which have been described, will be briefly described again in accordance with a concrete example of code amount estimation by means of an H.264 encoding method.

Techniques Relating to the Present Invention

In comparison with variable length coding (CAVLC), arithmetic coding (CABAC) has a higher degree of encoding efficiency, but requires a higher computation cost. However, in order to control the amount of code, it is necessary to detect the amount of generated code quickly. Therefore, the amount of code is estimated using the variable length coding (CAVLC) which performs high-speed operation and requires a small computation cost, and the actual encoding is executed by performing CABAC in a separate process. That is, in a basic technique relating to the present invention, the actual encoding is performed using highly efficient CABAC (which produces a large delay), and the code amount estimation is performed using high-speed CAVLC (which produces a small delay).

When estimating the amount of code based on the above basic technique, the following specifications of CABAC and CAVLC should be considered.

Specification of CAVLC in H.264

In H.264, 4×4 DCT and 8×8 DCT are selectable. However, there is no variable length encoding table (VLC table) for 8×8 DCT.

Therefore, in order to use the VLC table for the 8×8 DCT instead, 64 (8×8) elements are divided into four parts (not a simple four division), so as to produce sets of 16 elements and to perform scanning four times. That is, four pseudo 4×4 DCT items are processed.

Accordingly, a VLC table for 4×4 DCT can be referred to (where four times reference is necessary).

Specification of CABAC in H.264

In CABAC in H.264, coefficients of 8×8 DCT are rearranged using a zigzag scanning similar to that employed in MREG-2, so as to perform encoding.

That is, in the scanning of CABAC, 64 coefficients are aligned on a straight line. In contrast, in CAVLC which performs scanning four times, four coefficient lines are produced, in each of which 16 coefficients are aligned on a straight line.

Problem Occurring when using CAVLC in Code Amount Estimation of CABAC

When encoding 8×8 DCT coefficients in H.264 by means of VLC, there is no VLC table for 8×8 DCT as described above, and thus 64 (8×8) elements are rearranged to four one-dimensional arrays. Each of the four arrays is regarded as a result of zigzag scanning, and is encoded by referring to a VLC table for 4×4 DCT.

On the other hand, when encoding 8×8 DCT coefficients in 1-1.264 by means of CABAC, 64 coefficients are rearranged in a one-dimensional form, and are encoded. When estimating the corresponding amount of code (required when applying CABAC to the encoding) by using a VLC table for CAVLC, the arrangement of one-dimensional data, that is, the scanning form, is different between CABAC and CAVLC.

In CABAC, 64 coefficients are sequentially zigzag-scanned simply. In contrast, in CAVLC, four scanning operations for 16 coefficients are performed so as to produce four one-dimensional data items.

Therefore, in the conventional technique which uses CAVLC for the code amount estimation of CABAC, not only the scanning for CABAC, but also the scanning for CAVLC must be executed only for the code amount estimation, which increases the computation cost.

In light of the above circumstances, an object of the present invention is to provide a novel encoding technique for accurately estimating the amount of generated code with a smaller amount of operation than the above-described conventional technique.

Means for Solving the Problem

In order to achieve the above object, the present invention relates to a video encoding system having two implementation methods for encoding coefficients of a large-sized orthogonal transformation, such as: a first information source encoding method in which encoding is performed after rearranging the coefficients to have a one-dimensional form; and a second information source encoding method in which the coefficients are divided into a plurality of one-dimensional arrangement groups and encoding is performed using a variable length encoding table for a smaller-sized orthogonal transformation. The present invention has:

(i) a device that performs a larger-sized orthogonal transformation, rearranges the quantized coefficients to have a one-dimensional form in the order defined in the first variable length encoding method, and stores Run-Level sets of the number Run of successive "0" coefficients and a significant coefficient Level which follows them;

(ii) a device that computes the number of groups based on an area proportion between the orthogonal transformation size having the variable length encoding table and a target orthogonal transformation size;

(iii) a device that classifies the Run-Level sets into groups having the number of groups;

(iv) a device that divides each Run by the number of groups, and sets the obtained quotient as Run;

(v) a device that determines a code length of each Run-Level set in each group by referring to the variable length encoding table of the second information source encoding method; and (vi) a device that computes the total sum of the determined code lengths, wherein the amount of code generated in the first information source encoding method is estimated to be the total sum of the code lengths of all groups.

The following are examples for classifying the Run-Level sets into the groups:

(i) a first example includes assigning an index number to each Run-Level set in the order of detection of the Run-Level sets, dividing each index number by the number of groups, and classifying the Run-Level sets having the same remainder for the division into the same group; and (ii) a second example includes accumulating a value obtained by adding 1 to each Run in the order of detection of the Run-Level sets, dividing each accumulated value by the number of groups, and classifying the Run-Level sets having the same remainder for the division into the same group.

Effect of the Invention

In accordance with the present invention, when performing code amount estimation by using an encoding table for a smaller-sized orthogonal transformation than the actually-performed orthogonal transformation, the code amount estimation can be highly accurately executed while reducing the amount of computation.

BRIEF DESCRIPTION OF THE DRAWINGS

FIG. 7A is a flowchart of a main routine in an encoding operation by which CAVLC can be used for code amount estimation of CABAC.

FIG. 7B is a flowchart of a CABAC process in the encoding operation.

FIG. 9 is a diagram showing a scanning order for each 4×4 block.

FIG. 10 is a diagram showing an example of zigzag scanning.

FIG. 14 is a diagram showing a scanning order of CABAC.

FIG. 15 is a diagram showing a scanning order of CAVLC.

Figure 1:
FIG. 1 is a diagram showing an example of group classification of Run-Level sets in 8×8 DCT into four groups.

1 8×8 quantized value storage buffer
2 pre-encoding process controller
3 8×8 scanning counter
4 8×8 scanning order reference table
5 run counter
6 run-level information storage buffer "B"
7 mode number manager
8 counter
9 set number computer
10 comparative controller
11 code amount estimation unit
12 shift operator
13 run-level information storage buffer
14 code amount estimation controller
15 VLC table storage memory
16 estimated code amount computation unit

BEST MODE FOR CARRYING OUT THE INVENTION

In accordance with the present invention, 64 coefficients of CABAC may produce scanning results of CAVLC. That is, a process of performing CAVLC scanning independently is omitted, and scanning results of CAVLC are produced using scanning results of CABAC.

In an example method of computing the number of groups in the present invention, the area of a large-sized orthogonal transformation is divided by the area of a small-sized orthogonal transformation, and the obtained quotient is set as the number of groups.

For example, if 8×8 DCT coefficients are divided into 4×4 DCT items, 64/16=4 and the number of groups is 4.

Additionally, in an example method of dividing Run-Level sets into a plurality of groups, index numbers are sequentially assigned to the Run-Level sets in the order of detection in the scanning of the sets, and each index number is divided by the number of groups, so as to use the obtained remainder for the group classification of the Run-Level sets.

In H.264, 8×8 DCT coefficients must be classified into four groups. In the above method, after the CABAC scanning for 8×8 DCT, the relevant Run-Level sets are classified into four groups which include: a first group generated by extracting the 1st, 5th, . . . , (4i+1)th Run-Level sets (i=0, 1, . . . ); a second group generated by extracting the 2nd, 6th, . . . , (4i+2)th Run-Level sets (i=0, 1, . . . ); a third group generated by extracting the 3rd, 7th, . . . , (4i+3)th Run-Level sets (i=0, 1, . . . ); and a fourth group generated by extracting the 4th, 8th, . . . , (4i+4)th Run-Level sets (i=0, 1, . . . ).

That is, the example of classifying Run-Level sets into four groups includes (i) a process of assigning numbers to the Run-Level sets in detection order of the results (i.e., the Run-Level sets) of CABAC scanning, and equally allocating group numbers 1, 2, 3, 4, 1, 2, 3, 4, . . . to the above assigned numbers from the smallest to the largest thereof, and (ii) a process of decreasing the length of each Run to one-fourth thereof.

In accordance with the present invention, Run-Level sets obtained for a large-sized DCT are classified into groups corresponding to a size of orthogonal transformation, which has an encoding table, and each Run of all Run-Level sets is divided by the number of groups, so that the obtained quotient is set as Run. Accordingly, the Run-Level sets obtained for a large-sized DCT are pseudoly classified into groups of Run-Level sets corresponding to a size of orthogonal transformation, which has an encoding table.

FIG. 1 shows an example of group classification of 8×8 DCT coefficients into four 4×4 DCT groups by using the remainder for 4.

In each obtained group, the Run-Level sets are regarded as Run-Level information for 4×4 DCT size. The amount of code required for them is computed by referring to a CAVLC table, and the sum of four amounts is output as an estimated amount of code.

In another example of classifying the Run-Level sets into a plurality of groups, each value computed by adding 1 to Run of each Run-Level set is accumulated in the detection order of scanning, and the sets are classified based on the remainder obtained by dividing the accumulated value of each set (the accumulated value including the value computed for the relevant set) by the number of groups.

Figure 2:
FIG. 2 is a diagram showing another example of group classification of Run-Level sets in 8×8 DCT into four groups.

FIG. 2 shows an example of four-group classification using the remainder for 4. Each accumulated value is obtained by sequentially accumulating a value computed by adding 1 to each Run. Each accumulated value is divided by 4 so as to obtain the remainder. The Run-Level sets having a remainder of 1 is allocated to group 1; the Run-Level sets having a remainder of 2 is allocated to group 2; the Run-Level sets having a remainder of 3 is allocated to group 3; and the Run-Level sets having a remainder of 0 is allocated to group 4.

As described above, in the present invention, the results (i.e., Run-Level sets) of CABAC scanning may be classified into four groups, so as to produce four pseudo one-dimensional data items. Accordingly, CAVLC can be used without performing scanning again so as to estimate the amount of code.

Therefore, the present invention can reduce the computation cost and estimate the amount of code with a high accuracy.

Below, a specific embodiment of the present invention will be explained with reference to the drawings.

Here, in an encoding apparatus using code amount estimation in accordance with the present invention, distinctive structural elements of the present invention are mainly explained, while detailed explanations of the other elements, which are equal to corresponding elements of the conventional technique and thus have already been explained, are omitted.

In the following embodiment, the amount of code required when encoding 8×8 DCT coefficients by means of CABAC is estimated using a table for 4×4 DCT.

The number of groups is fixed to "4" which is obtained by dividing the area of 8×8 DCT by the area of 4×4 DCT, and Run-Level information is classified into four groups by using the remainder for 4 of each index number.

Figure 4:
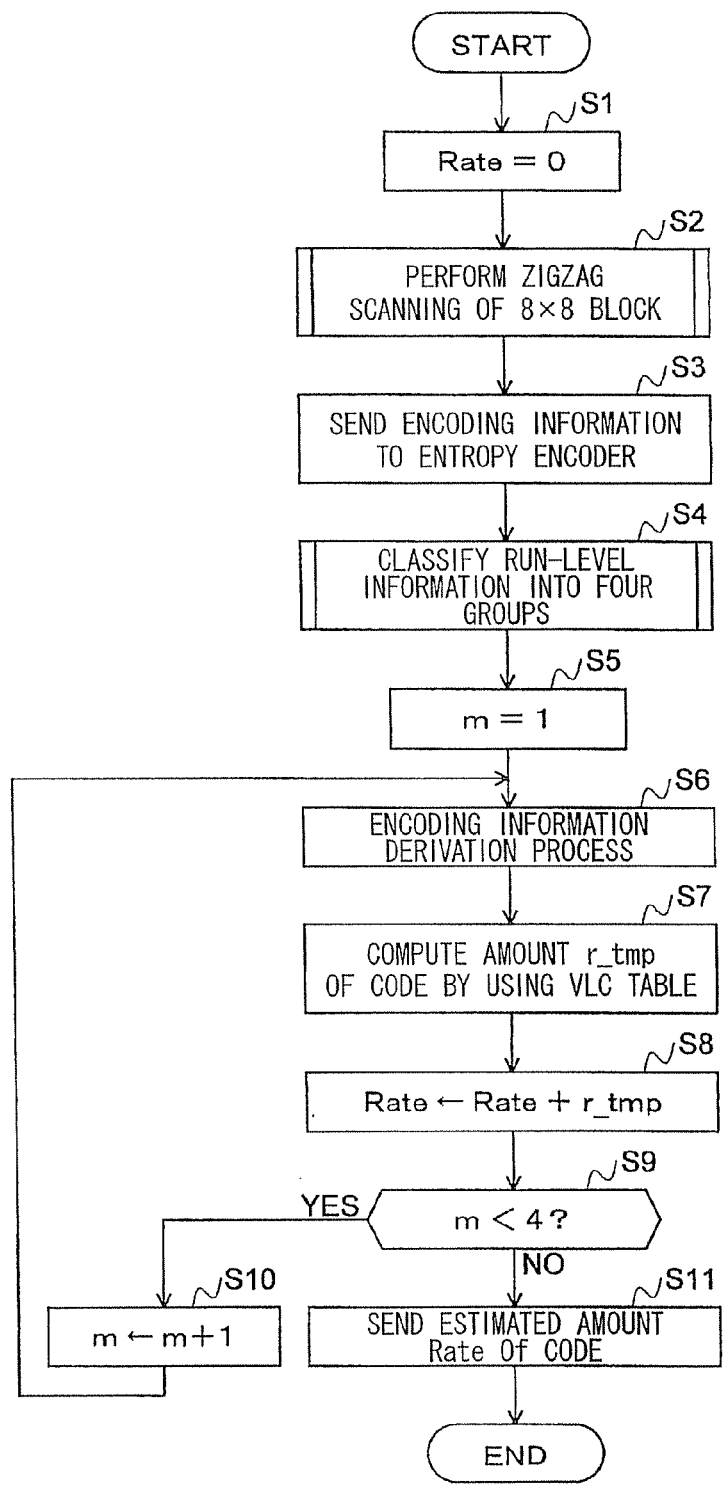
FIG. 4 is a flowchart of a pre-encoding processor in an embodiment of the present invention.

FIG. 4 is a flowchart of a pre-encoding processor in the present embodiment.

First, the estimated amount Rate of code is initialized at 0 (see step S1).

Figure 12:
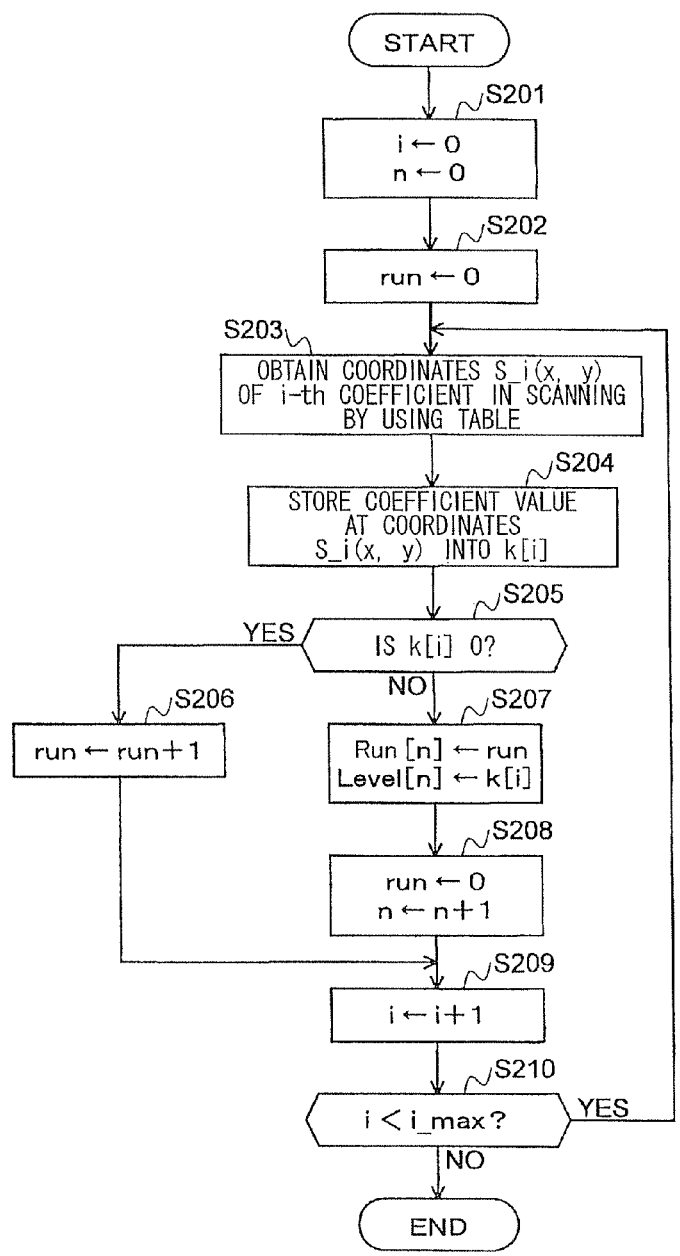
FIG. 12 is a diagram showing an example of an operation flow for zigzag scanning.
Figure 13:
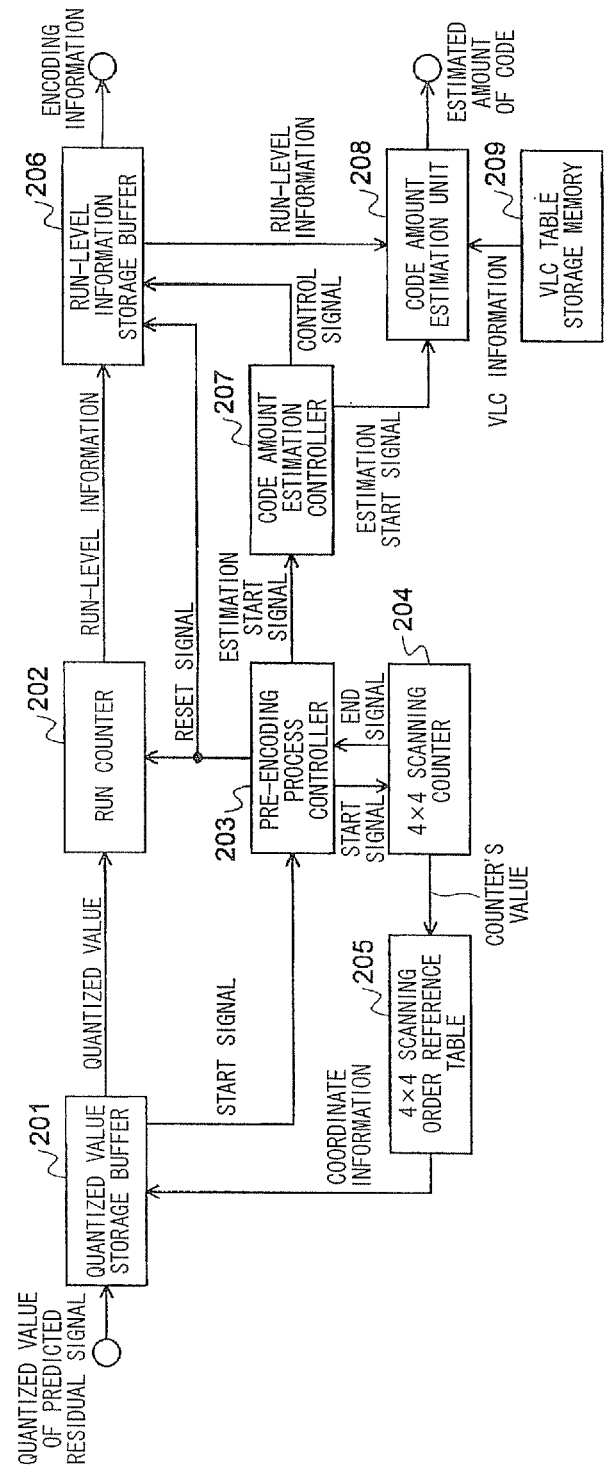
FIG. 13 is a diagram showing an example of the structure of the pre-encoding processor in FIG. 8.
Figure 16:
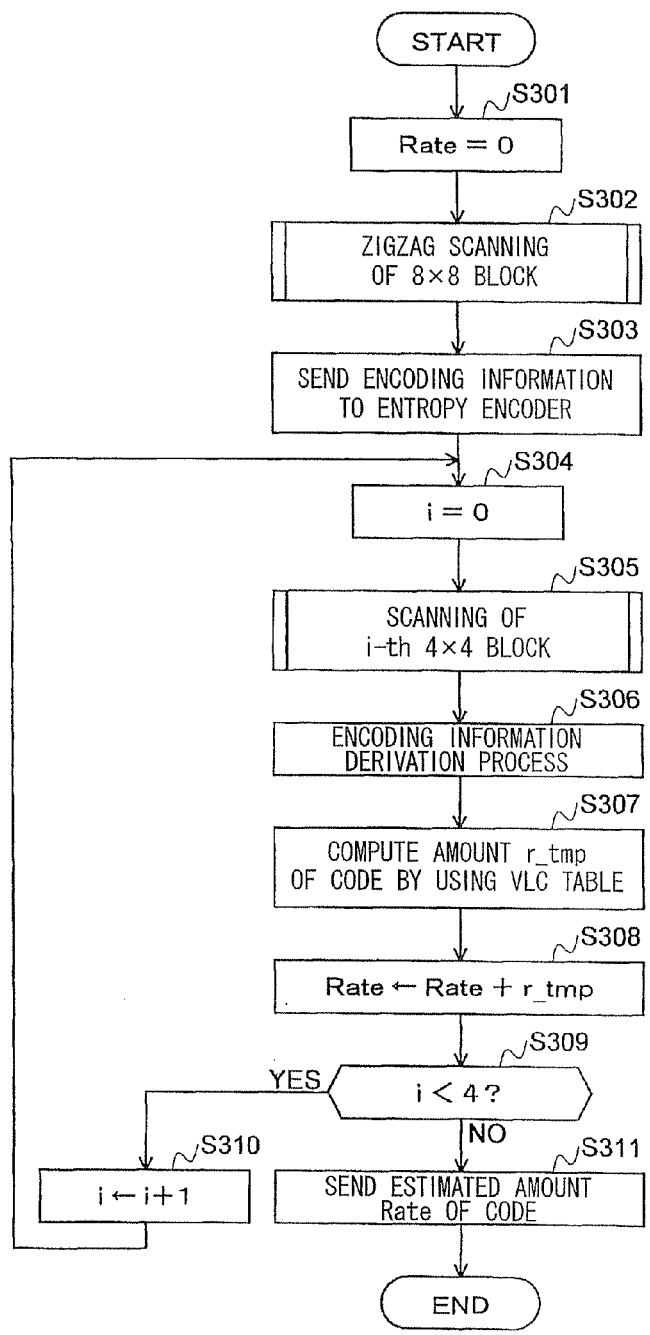
FIG. 16 is a flowchart of a pre-encoding processor for 8×8 DCT in accordance with a conventional technique.
Figure 17:
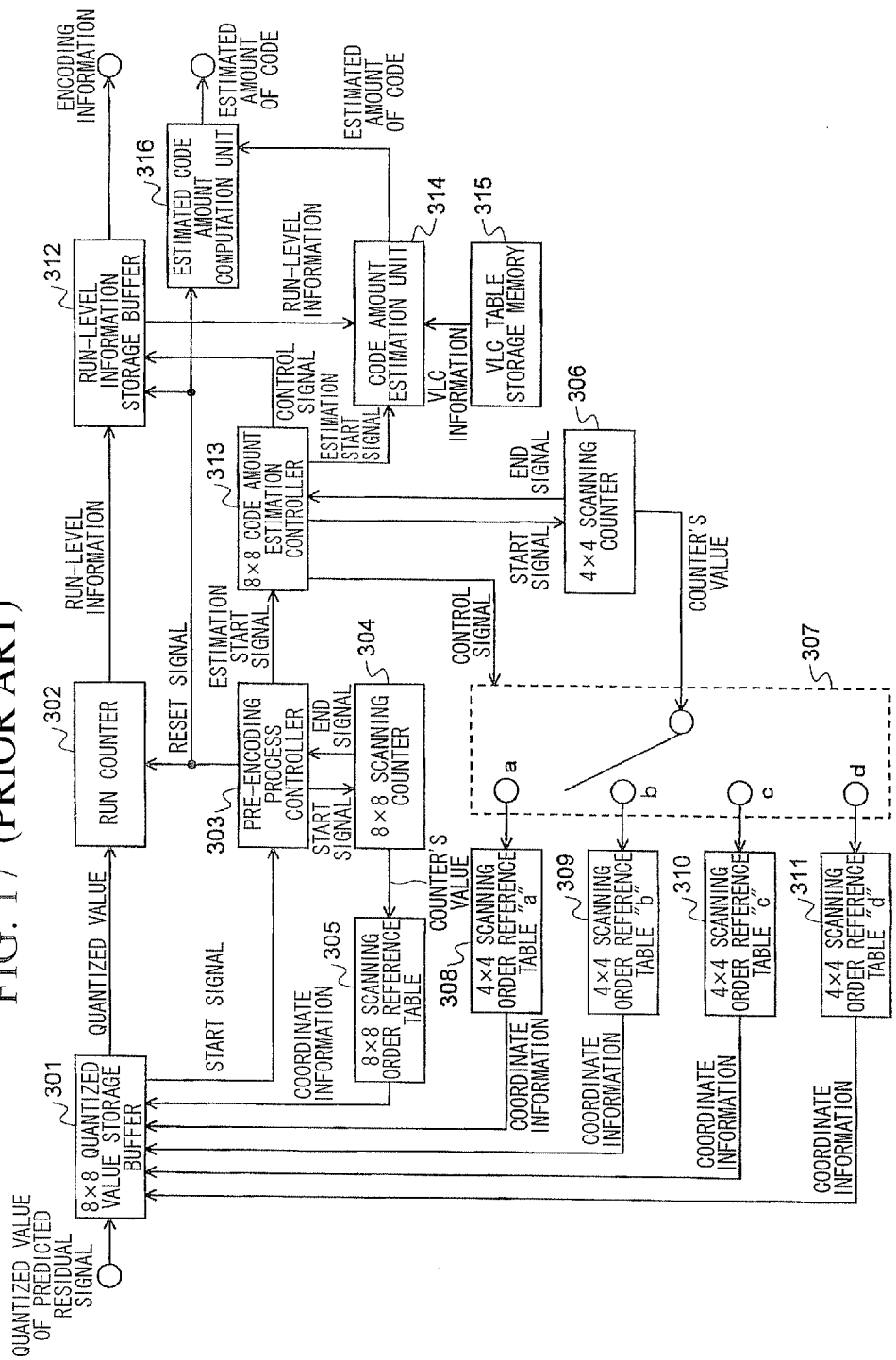
FIG. 17 is a diagram showing an example structure of the pre-encoding processor for 8×8 DCT in accordance with the conventional technique.

Next, an 8×8 block is subjected to zigzag scanning (see step S2), so that Run-Level information is generated. This process is shown in FIG. 12, and a scanning order reference table returns coordinates in the order shown in FIG. 14. The Run-Level information of the 8×8 block is sent as encoding information to an entropy encoder (see step S3).

Next, the obtained Run-Level information for the 8×8 block is classified into four modes (mode 1 to mode 4) (see step S4). An example of this process is shown in FIG. 5.

Figure 5:
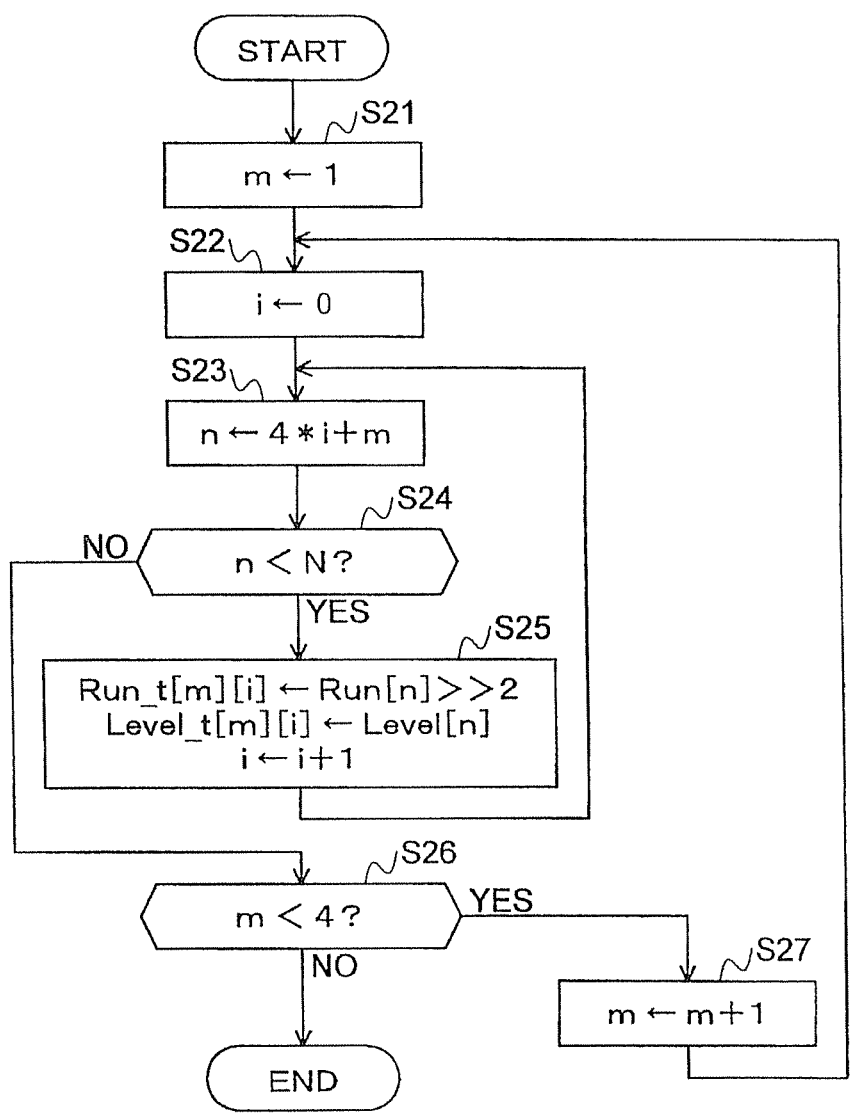
FIG. 5 is a flowchart showing an example process of classifying 8×8 DCT coefficients into four modes.

As shown in FIG. 5, first, variable m which indicates the mode number is set to 1 (see step S21), and Run-Level information of mode 1 is generated by the following operation.

After variable i is initialized at 0 (see step S22), and variable n is set to "4*i+m", where "*" indicates multiplication (see step S23).

If n is less than the number N of Run-Level information sets obtained by 8×8 DCT (i.e., the number of significant coefficients) (see step S24), then for n-th Run-Level information (Run[n] and Level[n]), Run[n] is shifted to the right by 2 bits, and the result is stored in Run_t[m][i], while Level[n] is stored in Level_t[m][i]. Additionally, i is incremented by 1 (see step S25).

The above operation (steps S23 to S25) is repeatedly performed.

When n exceeds N (see step S24), the mode is switched to the next mode.

After confirming that the mode number m is smaller than 4 (see step S26), m is incremented by 1 (see step S27), and the above-described operation is repeated. When the final mode 4 has been processed, the classification process is completed.

Accordingly, the i-th set of Run-Level information of the mode number m is stored in Run_t[m][i] and Level_t[m][i].

Now returning to FIG. 4, variable m is set to 1 again (see step S5). For mode 1, encoding information (i.e., the number of non-zero coefficients, the number of final succession of "1" or "−1" coefficients, and the positive or negative sign therefor) other than the Run-Level sets is obtained using each set of Run_t[m][i] and Level_t[m][i] (i=0, 1, . . . ) (see step S6), and amount r_tmp of code is computed using a VLC table (see step S7).

The computed amount r_tmp of code is added to the estimated amount Rate of code (see step S8). Then, if the mode number m is smaller than 4 (see step S9), m is incremented by 1 (see step S10), and the above-described operation is repeated for the next mode (see steps S6 to S10).

Finally, the estimated amount Rate of code is sent to a code amount controller (see step S11).

An operation in accordance with the present invention can be implemented by using a flowchart as explained above.

Next, an example of the structure for executing the present flowchart will be shown.

Figure 8:
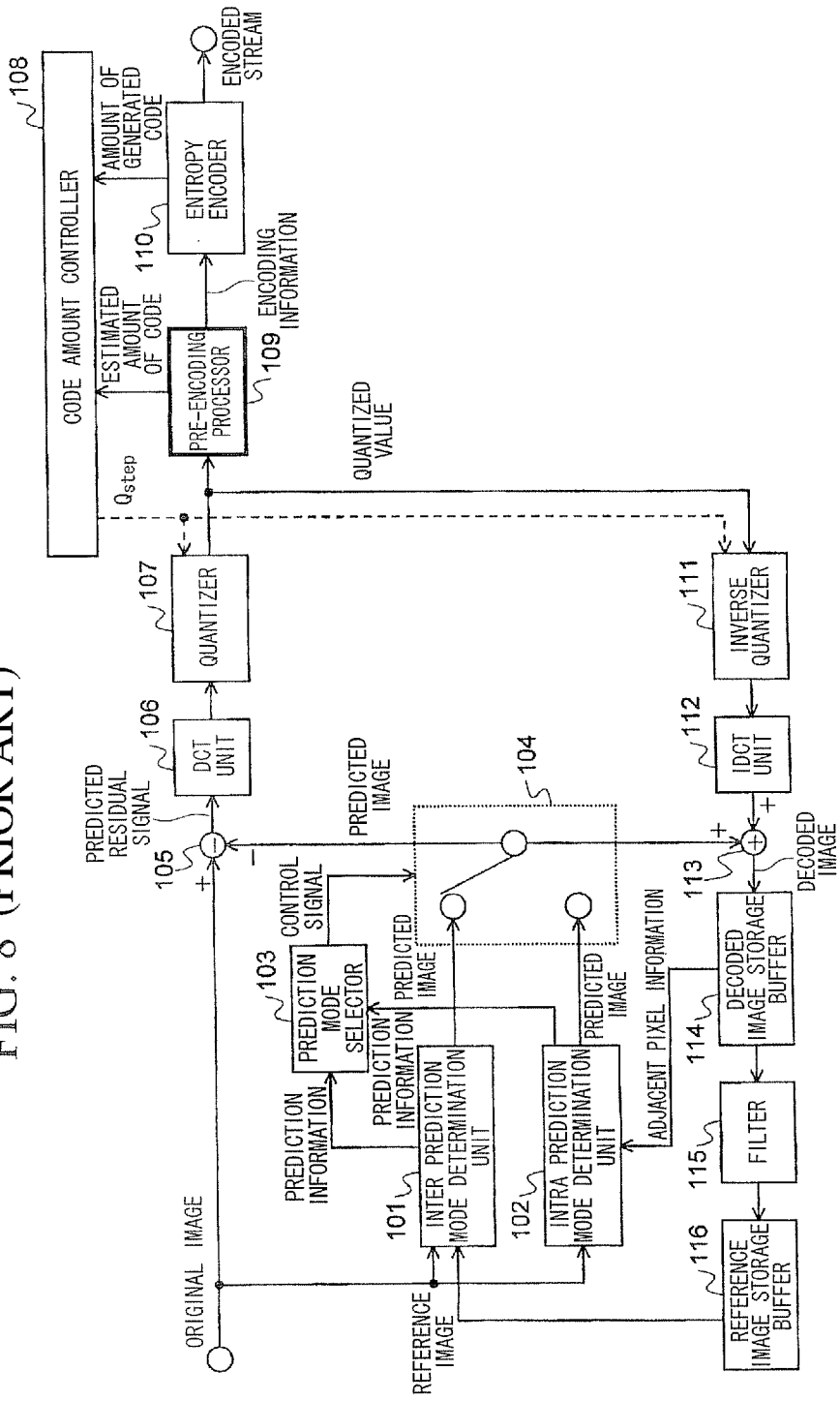
FIG. 8 is a diagram showing an example of an encoding apparatus for implementing the operation of FIGS. 7A and 7B.
Figure 11:
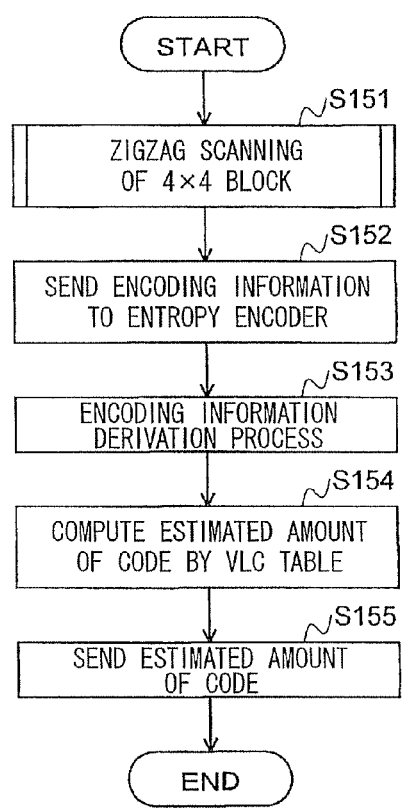
FIG. 11 is a diagram showing an example of an operation flow executed by a pre-encoding processor for a 4×4 block.

The structure of the relevant encoding apparatus can be shown similar to FIG. 8 for the conventional technique. The present embodiment is applied to the pre-encoding processor 109 indicated by a bold block.

Figure 6:
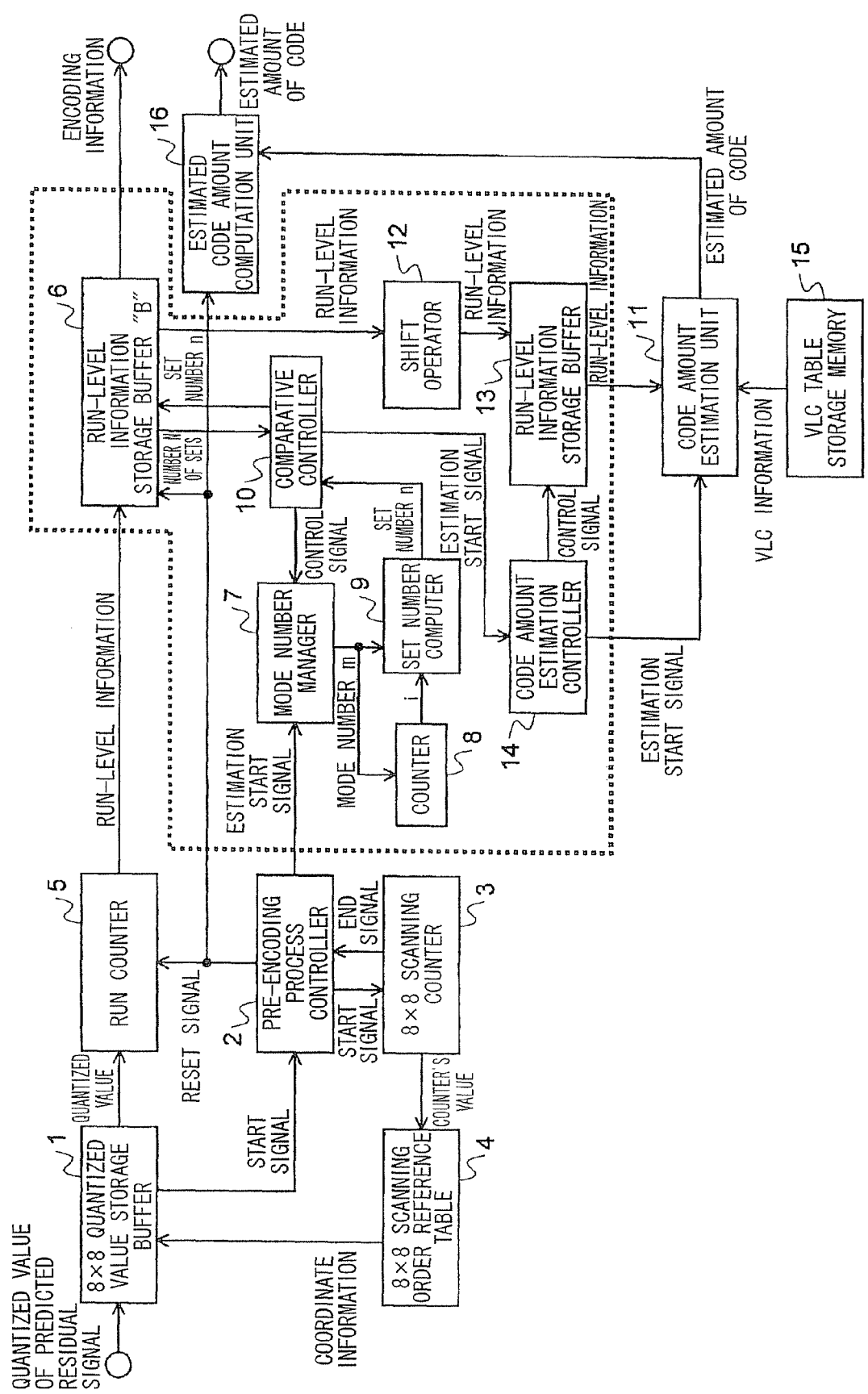
FIG. 6 is a diagram showing an example of the structure of an apparatus in accordance with the present invention.

Therefore, FIG. 6 shows an example of the structure of the pre-encoding processor 109. The present invention is applied to the part surrounded by a bold dotted line.

The pre-encoding processor of the present embodiment has an 8×8 quantized value storage buffer 1, a pre-encoding process controller 2, an 8×8 scanning counter 3, an 8×8 scanning order reference table 4, a run counter 5, a Run-Level information storage buffer "B" 6, a mode number manager 7, a counter 8, a set number computer 9, a comparative controller 10, a code amount estimation unit 11, a shift operator 12, a Run-Level information storage buffer 13, a code amount estimation controller 14, a VLC table storage memory 15, and an estimated code amount computation unit 16.

Among the above structural elements, the 8×8 quantized value storage buffer 1, the pre-encoding process controller 2, the 8×8 scanning counter 3, the 8×8 scanning order reference table 4, the run counter 5, the code amount estimation unit 11, the code amount estimation controller 14, the VLC table storage memory 15, the Run-Level information storage buffer 13, and the estimated code amount computation unit 16 have functions equal to those of the above-described structural elements having the same names.

When the Run-Level information storage buffer "B" 6 receives a reset signal from the pre-encoding process controller 2, the Run-Level information storage buffer "B" 6 initializes the stored information.

Next, when receiving Run-Level information from the run counter 5, the Run-Level information storage buffer "B" 6 stores the information, and sends the number of the Run-Level sets, as set information N, to the comparative controller 10.

Also when receiving the set number "n" from the comparative controller 10, the Run-Level information storage buffer "B" 6 sends n-th Run-Level information set to the shift operator 12.

When the mode number manager 7 receives an estimation start signal from the pre-encoding process controller 2, the mode number manager 7 sets the mode number "m" to 1, and sends it to the counter 8 and the set number computer 9.

In addition, when receiving a control signal from the comparative controller 10, the mode number manager 7 increments the mode number m by 1, and sends the incremented number to the counter 8 and the set number computer 9.

Also, when receiving the control signal after sending "4" as the mode number m, the mode number manager 7 sends the mode number "0" to the counter 8 and the set number computer 9, so as to stop the relevant operation until an estimation start signal is received again.

When the counter 8 receives the mode number m (i.e., 1 to 4), the counter 8 resets "i" to 0, and sends i to the set number computer 9 while incrementing i (from 0) by 1. When receiving 0 as the mode number, the counter 8 stops its operation.

When the set number computer 9 receives the mode number m from the mode number manager 7 and the value i from the counter 8, the set number computer 9 computes the set number n by "n=4*i+m", and sends the set number n to the comparative controller 10.

The comparative controller 10 compares the set number n sent from the set number computer 9 with the number N sent from the Run-Level information storage buffer "B" 6. If n is less than or equal to N, the comparative controller 10 sends the set number n to the Run-Level information storage buffer "B" 6. If n is larger than N, the comparative controller 10 sends a control signal to the mode number manager 7, and also sends an estimation start signal to the code amount estimation controller 14.

When the shift operator 12 receives the Run-Level information from the Run-Level information storage buffer "B" 6, the shift operator 12 shifts the value of Run to the right by 2 bits, and then sends the values of Run and Level as a set to the Run-Level information storage buffer 13.

By employing the above structure, the operation shown in FIGS. 4 and 5 can be implemented.

The above-described code amount estimation operation can also be implemented by a computer and a software program. Such a computer program may be provided by storing it in an appropriate computer-readable storage medium, or by means of a network.

The effect of reducing the amount of computation in accordance with the present invention is considerable especially when the number of significant coefficients is small.

For example, in H.264, even when only one set of Run-Level information is obtained by 8×8 DCT, a zigzag scanning operation (see FIG. 14) for code amount estimation should be executed four times in the conventional technique. In contrast, in the present invention, the amount of code can be estimated only by subjecting the one set of Run-Level information to 2-bit shifting and by referring to a table.

Figure 3:
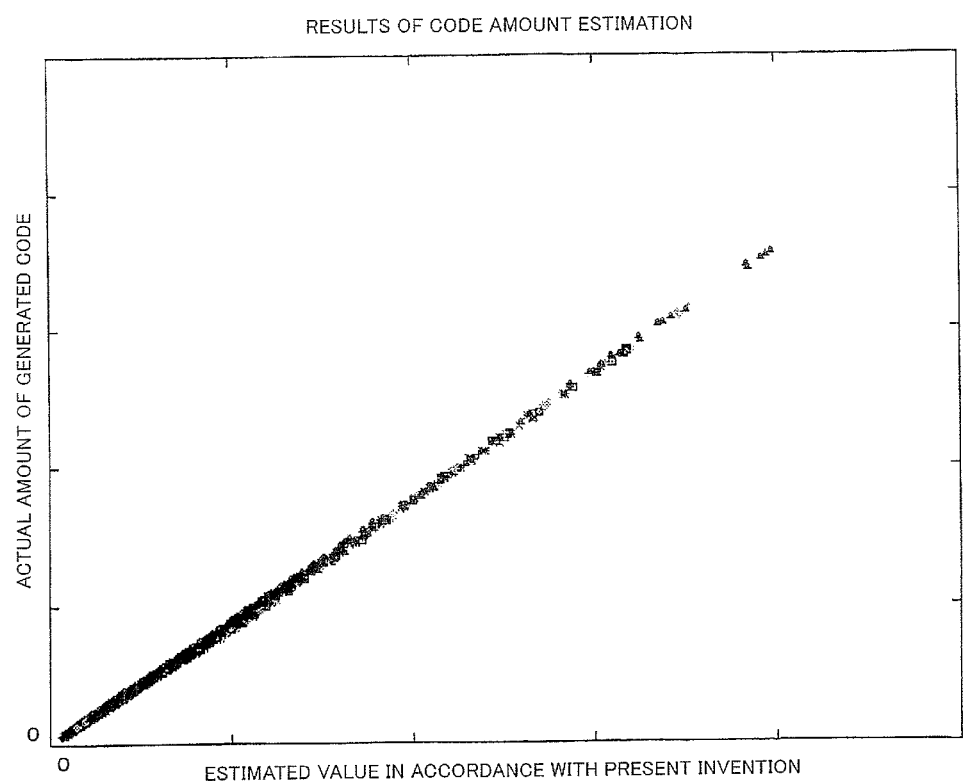
FIG. 3 is a graph showing results of code amount estimation when applying the present invention to H.264.

FIG. 3 shows results of code amount estimation when applying the present invention to encoding in H.264.

Specifically, FIG. 3 shows plotting for all macroblocks when 8×8 DCT is performed, where the horizontal axis indicates each estimated amount of code in accordance with the present invention, and the vertical axis indicates each amount of code generated when using CABAC.

Group classification was performed using the remainder of 4.

The shown results indicate that the estimated value by the present invention is in proportion to the actual amount of generated code by CABAC, and code amount estimation can be accurately performed by a method in accordance with the present invention.

One reason for accurately performing code amount estimation by a method of the present invention is shown below.

In the specification of CAVLC in H.264, the method of dividing 64 (8×8) elements into four groups produces a result in that low-frequency and high-frequency components are included as equally as possible in the four divided one-dimensional data groups.

Also in the present invention, a method of classifying CABAC scanning results (i.e., Run-Level sets) into four groups produces a result in that low-frequency and high-frequency components of the relevant coefficients are included as equally as possible in the four groups.

Therefore, as shown in the results of code amount estimation in FIG. 3, highly accurate results of code amount estimation by CAVLC can be obtained.

INDUSTRIAL APPLICABILITY

In accordance with the present invention, when performing code amount estimation by using an encoding table for a smaller-sized orthogonal transformation than the actually-performed orthogonal transformation, the code amount estimation can be highly accurately executed while reducing the amount of computation.

The invention claimed is:

1. A video encoding method comprising:
    encoding at least one frame of a video signal using an encoder that selectively applies one of: (a) a first information source encoding method in which a plurality of orthogonal transformation sizes are selectable and encoding is performed by rearranging quantized two-dimensional orthogonal transformation coefficients to have a one-dimensional form, and (b) a second information source encoding method which has a lower computation cost than the first information source encoding method and performs encoding using a variable length encoding table, based on an amount of code estimation performed according to the following steps:
    performing rearrangement, when encoding quantized values of coefficients of a larger-sized orthogonal transformation than an orthogonal transformation size assigned to the variable length encoding table, by rearranging the quantized values to have a one-dimensional form in the order defined in the first information source encoding method, wherein in the one-dimensional form, Run-Level sets of the number Run of successive "0" coefficients and a significant coefficient Level which follows them are obtained, and the obtained Run-Level sets are stored;
    computing the number of groups based on a proportion between an orthogonal transformation area corresponding to the orthogonal transformation size assigned to the variable length encoding table and an orthogonal transformation area for an encoding target;
    classifying the Run-Level sets into groups having the number of groups;
    dividing Run of each Run-Level set by the number of groups, and setting the obtained quotient as Run of the Run-Level set;
    determining a code length of each Run-Level set in each group by referring to the variable length encoding table; and
    computing the total sum of the determined code lengths, wherein the amount of code generated in the first information source encoding method is estimated to be the total sum of the code lengths of all groups,
    wherein the first information source encoding method is a context-adaptive binary arithmetic coding method, and the second information source encoding method is a context-adaptive variable length coding method.

2. The video encoding method in accordance with claim 1, wherein the step of classifying the Run-Level sets into the groups includes assigning an index number to each Run-Level set in the order of detection of the Run-Level sets, dividing each index number by the number of groups, and classifying the Run-Level sets having the same remainder for the division into the same group.

3. The video encoding method in accordance with claim 1, wherein the step of classifying the Run-Level sets into the groups includes accumulating a value obtained by adding 1 to each Run in the order of detection of the Run-Level sets, dividing each accumulated value by the number of groups, and classifying the Run-Level sets having the same remainder for the division into the same group.

4. A non-transitory computer-readable storage medium which stores a video encoding program by which a computer executes the video encoding method in accordance with claim 1.

5. A video encoding apparatus comprising:
an encoder that encodes at least one frame of a video signal by selectively applying one of: (a) a first information source encoding method in which a plurality of orthogonal transformation sizes are selectable and encoding is performed by rearranging quantized two-dimensional orthogonal transformation coefficients to have a one-dimensional form, and (b) a second information source encoding method which has a lower computation cost than the first information source encoding method and performs encoding using a variable length encoding table, based on an amount of code estimation generated using the following circuit components:
a device that performs rearrangement, when encoding quantized values of coefficients of a larger-sized orthogonal transformation than an orthogonal transformation size assigned to the variable length encoding table, by rearranging the quantized values to have a one-dimensional form in the order defined in the first information source encoding method, wherein for the one-dimensional form, the device obtains Run-Level sets of the number Run of successive "0" coefficients and a significant coefficient Level which follows them, and stores the obtained Run-Level sets;
a device that computes the number of groups based on a proportion between an orthogonal transformation area corresponding to the orthogonal transformation size assigned to the variable length encoding table and an orthogonal transformation area for an encoding target;
a device that classifies the Run-Level sets into groups having the number of groups;
a device that divides Run of each Run-Level set by the number of groups, and sets the obtained quotient as Run of the Run-Level set;
a device that determines a code length of each Run-Level set in each group by referring to the variable length encoding table; and
a device that computes the total sum of the determined code lengths,
wherein the amount of code generated in the first information source encoding method is estimated to be the total sum of the code lengths of all groups,
wherein the first information source encoding method is a context-adaptive binary arithmetic coding method, and the second information source encoding method is a context-adaptive variable length coding method.

* * * * *